(12) United States Patent
Kubby et al.

(10) Patent No.: US 6,467,879 B1
(45) Date of Patent: Oct. 22, 2002

(54) METHOD AND APPARATUS FOR PREVENTING DEGRADATION OF ELECTROSTATICALLY ACTUATED DEVICES

(75) Inventors: Joel A. Kubby, Rochester; Elliott A. Eklund, Penfield; Peter M. Gulvin, Webster, all of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/687,096

(22) Filed: Oct. 16, 2000

(51) Int. Cl.⁷ .................................................. B41J 2/04
(52) U.S. Cl. ........................................................ 347/54
(58) Field of Search ............................. 347/54, 68, 69, 347/70, 71, 72, 50, 40; 399/261; 361/700; 29/890.1; 310/328–330

(56) References Cited

U.S. PATENT DOCUMENTS

| | | | |
|---|---|---|---|
| 5,617,632 A | 4/1997 | Saaski et al. | |
| 5,771,321 A | 6/1998 | Stern | |
| 5,867,302 A | 2/1999 | Fleming | |
| 5,883,532 A | 3/1999 | Bowers | |
| 5,895,866 A | 4/1999 | Neukermans et al. | |
| 6,127,198 A | 10/2000 | Coleman et al. | |
| 6,234,607 B1 * | 5/2001 | Sakai et al. | 347/54 |

* cited by examiner

Primary Examiner—Raquel Yvette Gordon
(74) Attorney, Agent, or Firm—Lloyd F. Bean, II

(57) ABSTRACT

A micro-electromechanical fluid ejector having an inner structure on the bottom of the top of the membrane for isolating the conductor, and an outer structure, away from the center of the membrane, on the bottom of the top of the membrane to stop excessive flexing of the membrane leading to inter-electrode contact.

11 Claims, 4 Drawing Sheets

FIG. 1
(PRIOR ART)
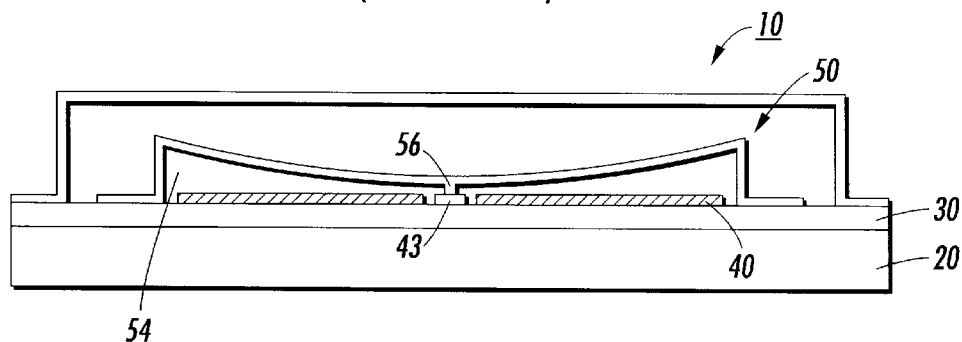
FIG. 2
(PRIOR ART)
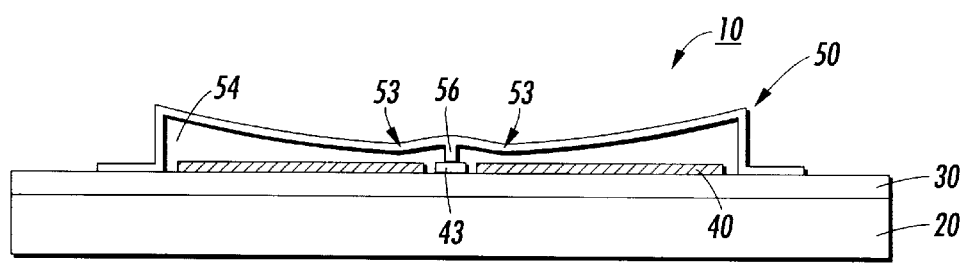
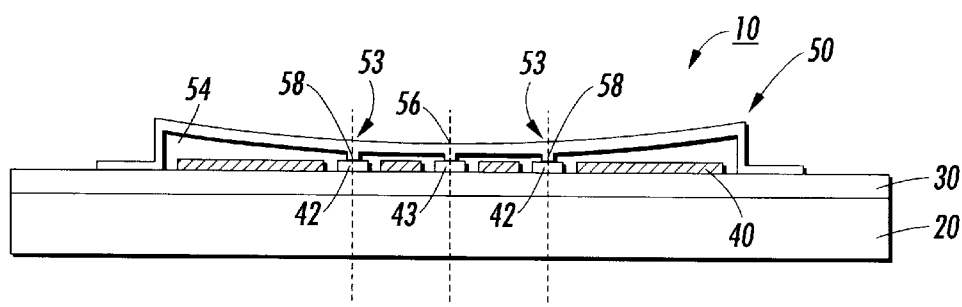
FIG. 3

METHOD AND APPARATUS FOR PREVENTING DEGRADATION OF ELECTROSTATICALLY ACTUATED DEVICES

CROSS REFERENCE

Cross-reference is made to co-pending application U.S. patent application Ser. No. 09/416,329, (D/98191) entitled "Micro-Electro-Mechanical Fluid Ejector And Method Of Operating Same," filed on Oct. 12, 1999, the entire disclosure of which is hereby incorporated by reference.

BACKGROUND OF THE INVENTION

The present invention relates to electrostatically actuated devices and more particularly to silicon-based actuators, which are used, for example, in ink-jet printing, fluid pumping and optical switching, for preventing electrical breakdown in electrostatically actuated devices.

In ink-jet printing, droplets of ink are selectively ejected from a plurality of drop ejectors in a print head. The ejectors are operated in accordance with digital instructions to create a desired image on a print medium moving past the print head. The print head may move back and forth relative to the sheet in a typewriter fashion, or in the linear array may be of a size extending across the entire width of a sheet, to place the image on a sheet in a single pass.

The ejectors typically comprise actuators connected to both a nozzle and drop ejection aperture and to one or more common ink supply manifolds. Ink is retained within each channel until there is a response by the actuator to an appropriate signal. In one embodiment of the ejector, the ink drop is ejected by the pressure transient due to volume displacement of an electrostatically or magnetostatically actuated deformable membrane, which typically is a capacitor structure with a flexible electrode, fixed counter electrode, and actuated by a voltage bias between the two electrodes.

Silicon-based actuators also can be employed in microelectromechanical devices that can be used for pumping and switching, and wherein for example, silicon based actuators are, respectively, used for microfluid pumping, and optical switching. Fluids are pumped due to the volume displacement of an electrostatically or magnetostatically deformable membrane, which is a capacitor structure with a flexible electrode, fixed counter electrode, and actuated by a voltage bias between the two silicon electrodes. Optical switching occurs by the displacement of optical elements as a result of actuation due to electrostatic or magnetostatic interactions with other on-chip elements or magnetostatic device package. For example, in optical switching a mirror can be employed as the optical element using electrostatic actuators to provide the displacement.

This capacitor structure which incorporates a deformable membrane for these silicon-based actuators can be fabricated in a standard polysilicon surface micro-machining process. It can be batch fabricated at low cost using existing silicon foundry capabilities. The surface micro-machining process has proven to be compatible with integrated microelectronics, allowing for the monolithic integration of the actuation with associated addressing electronics.

A problem associated with capacitive-based electrostatic actuators, and in particular the above-described silicon-based actuators, is the undesirable electrode damage resulting from contact and arcing between the electrodes of the micro-electro-mechanical structure (MEMS), which is observed after a few thousand cycles. The thin silicon membranes will flex enough to allow inter-electrode contact at some point between the device center, which is supported and prevented from contact, and the edge of the membrane, which is also spaced from the counter-electrode. The contact and subsequent arcing at these intermediate points are linked to early degradation and failure of the capacitor structure, significantly shortening the life of the actuator.

It is an object of the invention to prevent membranes with large surface area from contacting the counter-electrode.

SUMMARY OF THE INVENTION

There is provided an electrostatic device including a semiconductor substrate with an insulating layer, or an insulating substrate, a conductor on the insulating layer, a flexible membrane with its sides supporting itself above the conductor (counter-electrode), and an actuator chamber formed between the membrane and the opposing counter-electrode. A power source is connected between the counter-electrode and the membrane and when activated the resulting force is sufficient to deflect the flexible membrane toward the counter-electrode, thereby increasing the supply of fluid in a chamber above the membrane. As the power source is removed, the membrane will return to its equilibrium position, thus pressurizing the fluid in the chamber above the movable membrane. The addition of the structures between the membrane and counter-electrode, which act to prevent the two electrodes from touching due to excessive flexure of the membrane, prevents arcing and subsequent damage when the device is actuated.

These and other aspects of the invention will become apparent from the following description, the description being used to illustrate a preferred embodiment of the invention when read in conjunction with the accompanying drawings.

BRIEF DESCRIPTION OF THE DRAWINGS

FIG. 1 shows a cross-sectional view of the electrostatic actuated diaphragm with only the inner structure.

FIG. 2 shows a cross-sectional view of the electrostatic actuated diaphragm with only the inner structure showing typical distortion.

FIG. 3 shows a cross-sectional view of the electrostatic actuated diaphragm with the added outer structure.

DETAILED DESCRIPTION OF THE INVENTION

While the present invention is described below with reference to an ink jet print head, a practitioner in the art will recognize the principles of the present invention are applicable to other applications as discussed supra.

Figure 7:
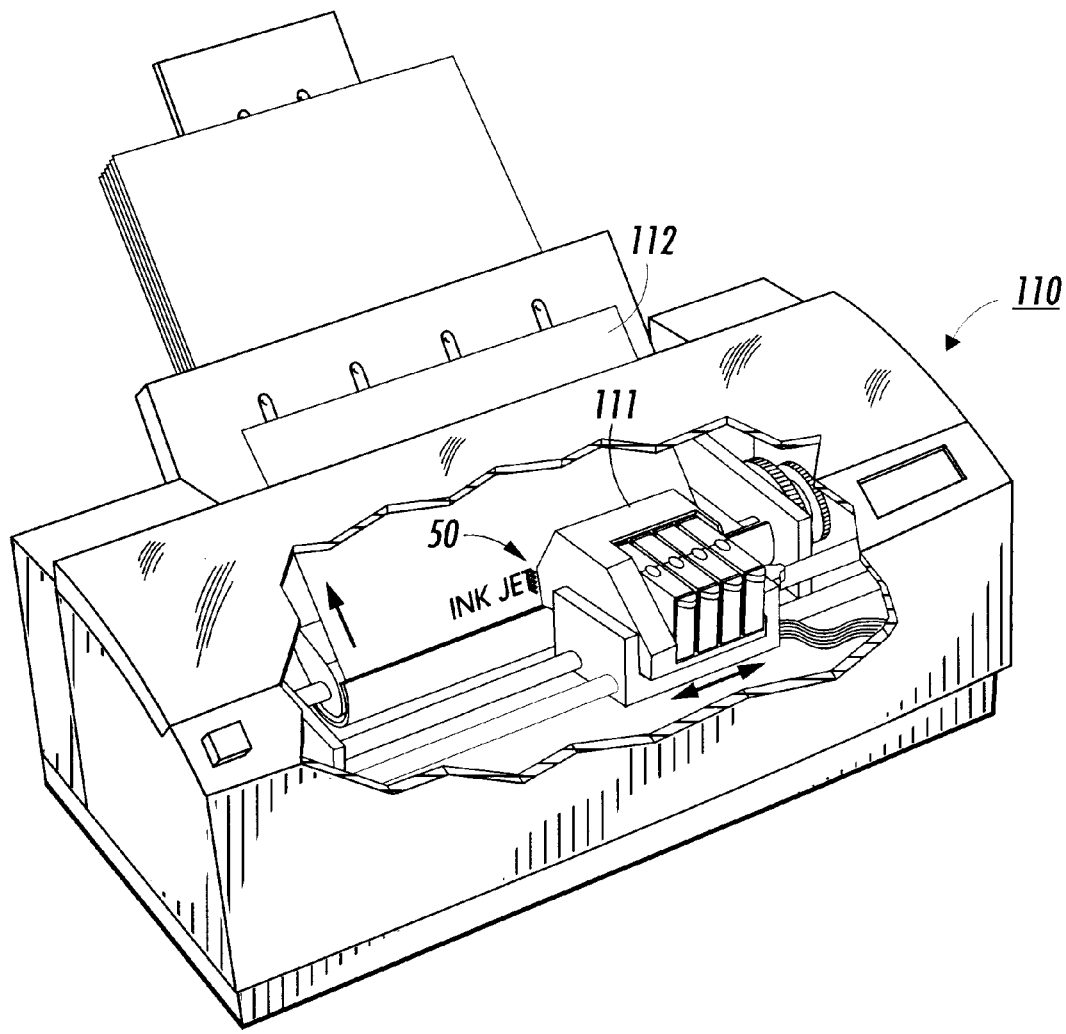
FIG. 7 shows an ink-jet printer with a drop ejector print head.

Now referring to FIG. 7, incorporating the print head 111 and actuator drop ejector 50 of the present invention, in an ink-jet printer 110, droplets of ink are ejected from several drop ejectors 50 in print head 111, onto a sheet 112. The ejectors are operated in accordance with digital instructions to create a desired image on a print medium moving past the print head 111. The print head 111 may move back and forth relative to the sheet in a Scanning motion to generate the printed image swath by swath. Alternately, the print head may be held fixed and the media moved relative to it, creating an image as wide as the print head in a single pass.

Turning to FIGS. 1–4, the drop ejector utilizes deformable membrane 50 as an actuator. The membrane can be formed using standard polysilicon surface micro-machining, where the polysilicon structure that is to be released is deposited on a sacrificial layer that is finally removed. Electrostatic forces between deformable membrane 50 and counter-electrode 40 deform the membrane. In one embodiment the membrane is actuated using a voltage drive mode, in which a constant bias voltage is applied between the parallel plate conductors that form the membrane 50 and the counter-electrode 40, which is useful for a drop generating device that ejects a constant drop size. In another mode of operation the membrane is actuated using a charge drive mode, wherein the charge between the parallel plate conductors is controlled, thus enabling a variable drop size device. The two different modes of operation, voltage drive and charge drive, lead to different actuation forces but either use the same or a different power source.

In the voltage drive mode, the membrane and counter-electrode system is considered as a parallel plate capacitor. The electrostatic actuation force is non-linear in both voltage and displacement. The restoring force is given by stretching of the membrane, which may be one of a plurality of shapes such as, for example, a circular membrane. The restoring force is linear in the central deflection of the membrane. Since the mechanical restoring force is linear and the actuating force is non-linear, with respect to the gap spacing, the system has a well-known instability called "pull-in" when the actuating force exceeds the restoring force. This instability occurs when the voltage is increased enough to decrease the gap to $\frac{2}{3}$ of its original value. In the voltage drive mode the diaphragm is actuated between two positions, relaxed and completely pulled-in, which gives rise to a repeatable volume reduction of the actuator chamber when a voltage exceeding the pull-in voltage is applied. This is useful for a constant drop size ejector. The pull-in instability also has hysteresis since the solution for the membrane position is double valued. One solution exists for the membrane pulled down to the counter-electrode, and another solution exists for the membrane pulled down to less than $\frac{1}{3}$ of the original gap. This allows the steady-state holding voltage to be reduced after the membrane is pulled down by a larger pull-in voltage.

In the charge drive mode the membrane and counter-electrode system is considered as a parallel plate capacitor, but now the actuation force results when the capacitor is supplied with a controllable amount of charge. The electrostatic actuation force is independent of the gap between the plates of the capacitor, and thus the pull-in instability for the voltage drive mode is avoided. This allows the deflection of the membrane to be controlled throughout the range of the gap, and gives rise to a variable volume reduction of the actuator chamber when a variable amount of charge is placed on the capacitor plates. This is useful for a variable drop size ejector.

The pull-in voltage has repeatable behavior because a structure 56 has been attached to the membrane 50 in order to avoid contact with the electrodes 40. When the membrane is pulled down toward the counter-electrode the structure 56 lands on the electrically isolated landing pad 43 and avoids contact. In this way it is not necessary to include the insulating layer between the diaphragm and the counter-electrode 40. Addition of an insulating layer in other ink jet designs leads to trap charge at the interface between the dielectric and the insulator resulting in unrepeatable behavior. The pull-in voltage remains repeatable because an outer structure 58 prevents distortion of the membrane at the susceptible region 53. This defines minimum electrode spacing similar or equal to the spacing at the membrane center, eliminating inter-electrode contact and arcing at the susceptible region 53.

The membrane pressure exerted on the fluid in the pressure chamber after actuation of the membrane under an applied electrostatic field of 300 MV/m, and subsequent release of the membrane, would allow for the generation of a pressure of 3.8 atm. This pressure is an order of magnitude above the pressure required to expel a fluid droplet. When the gap between the membrane and counter-electrode 40 is 1 um, an applied voltage of 82.3 volts is required to generate actuation resulting in an increased pressure of 0.3 atm over ambient in the fluid chamber. This is sufficient to overcome the viscous and surface tension forces of the liquid in order to expel a drop. The field in the gap would be 82.3 MV/m. This is beyond the 3 MV/m limit for avalanche breakdown (sparks) in macroscopic air gaps, but it is below the limiting breakdown in microscopic air gaps. In microscopic samples, with gaps on the order of 1 um, the avalanche mechanism in air is suppressed because the free carrier mean free path is not long enough to the permit multiple collisions necessary to sustain avalanche conditions. In micron-sized gaps the maximum field strength is limited by other mechanisms, such as field emission from irregularities on the conductor surface.

The displacement volume will be reduced for a given membrane area with the inner structure 56 and outer structure 58. However, increasing the membrane 50 radius slightly would overcome the reduced displacement due to the inner structure 56 and outer structure 58. Thus for a gap of 2 um and a radius of 155 um, the displacement volume would be 41.9 pL. This is about a factor of 3 greater than the drop size of a 600 spot per inch (spi) droplet. This increase in displacement volume should allow sufficient overhead to compensate for the reduction in displacement volume associated with the inner structure 56 and the outer structure 58.

Now referring to the present invention in more detail, the present invention adds structures similar to the central structure, at a radial position between the center and the edge of the actuator, so as to prevent contact of the deformable membrane at the susceptible region. Consequently, electrical breakdown and arcing is reduced, which has been directly linked to early membrane degradation and failure.

FIG. 1 shows a cross-sectional view of an electrostatically actuated diaphragm 10 which has been displaced from its relaxed position by an application of a voltage or current between membrane 50 and conductor 40. The motion of membrane 50 then reduces the actuator chamber volume. Actuator chamber 54 can either be sealed at some other pressure, or open to atmosphere to allow the air in the actuator chamber to escape (hole not shown). For gray scale printing, which uses the charge-drive mode, the membrane can be pulled down to an intermediate position. The volume reduction in the actuator chamber will later determine the volume of fluid displaced when an upper chamber and nozzle plate has been added. Substrate 20 is typically a silicon wafer. However, substrate 20 may be an insulating material such as glass. Insulator 30 is typically a thin film of silicon nitride. Conductor 40 acts as the counter electrode and is typically either a metal or a doped semiconductor film such as polysilicon. Membrane 50 is made from a structural material such as polysilicon, and is typically fabricated in a surface micro-machining process. It can also be another conducting material such as thin metallic film. Inner structure 56 is attached to a part of membrane 50 and acts to separate the membrane from the conductor, when the membrane is pulled down towards the conductor under electrostatic attraction, when a voltage or current is applied between the membrane and the conductor. Actuator chamber 54 between membrane 50 and substrate 20 can be formed using typical techniques such as are used in surface micro-machining. A sacrificial layer such as silicon dioxide, deposited by chemical vapor deposition (CVD), is then covered over by the structural material that forms the membrane. An opening left at the edge of the membrane (not shown) allows the sacrificial layer to be removed between the membrane and counter-electrode in a post-processing etch. A typical etchant for oxide is concentrated hydrofluoric acid. In this processing step inner structure 56 acts to keep the membrane from sticking to the underlying surface when the liquid etchant capillary forces pull it down.

FIG. 2 is a cross-sectional view of a microelectromechanical structure (MEMS) actuator 10 showing distortion of the membrane 53 which leads to contact and arcing, with the resulting damage shortening the life of the actuator. Typically the flexible membrane 50 is thin. When a voltage is applied the membrane 50 is actuated (pulled down) by the electrostatic force between it and the fixed counter electrode 40. An inner structure 56 on the underside of the membrane 50 rests on the electrically isolated center section (landing pad) 43 of the counter electrode. The distortion of the membrane valley 53 results in contact and arcing between the membrane and counter-electrode, damaging the actuator. In tests of the membrane 50, electrode 40 damage resulted due to contact and arcing between the electrodes 40 after a few thousand cycles. The breakdown and arcing occurs as the membrane 50 is pulled down and the membrane valley 53 flexes producing regions of extremely high (>160 volts/micron) electric field gap or physical contact between the two electrodes.

FIG. 3 is a cross-sectional view of the MEMS actuator 10 and membrane 50 modified to show the added outer structure 58 and insulated landing pad 42 of the present invention. The addition of the outer structure 58 and the insulated landing pad 42 prevents electrode contact and/or high field regions that occur as a result of flexing of the thin membrane 50. Elimination of the distorted membrane 53 eliminates the inter-electrode contact and prevents damage to membrane 50 caused by arcing between the electrodes 40. Additionally outer structure 58 and insulated landing pad 42 limits the travel of the membrane 50. The outer structure 58 and insulated landing pad 42 are similar to the inner structure 56 and the isolated landing pad 43. The outer structure 58 and insulated landing pad 42 are fabricated in the silicon surface micro-machining process, and consist of protrusions on the underside of the membrane 50 with corresponding landing pads patterned in the counter-electrode 40. The outer structure 58 and insulated landing pad 42 serve to define a minimum electrode 40 spacing in area 53 where contact is likely to occur, thus preventing arcing and actuator 10 failure.

Figure 4:
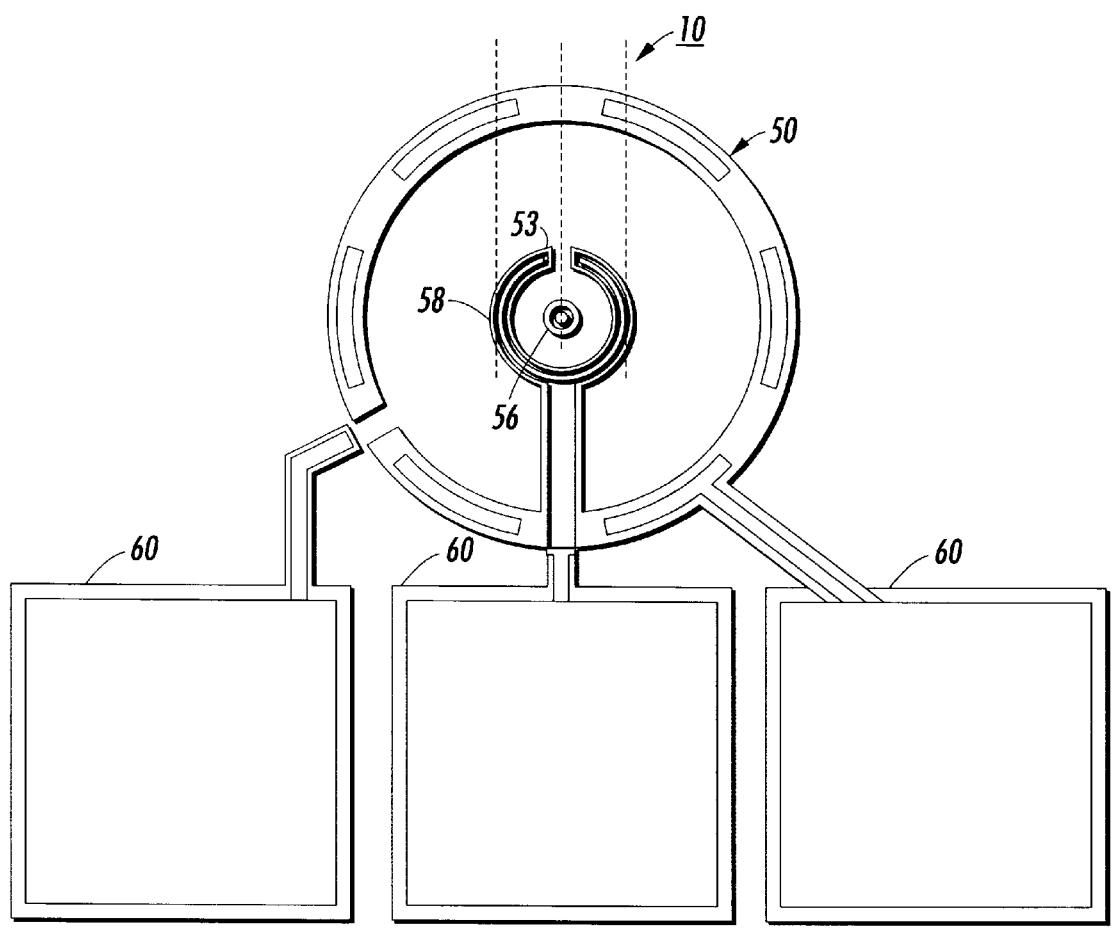
FIG. 4 shows a top-view of the electrostatic actuated diaphragm with the added outer structure.

FIG. 4 is a top-view of the MEMS drop ejector 10 with membrane 50 and contact pads 60. The outer structure 58 is located outwardly from the inner structure 56, at a outwardly position from inner structure 56, at a distance from the inner structure 56 that minimizes excessive flexing of the membrane 50 at the susceptible region 53. By defining a minimum electrode 40 spacing similar or equal to the spacing at the actuator 10 center, contact and resulting arcing will be eliminated and the life of the actuator 10 will be lengthened significantly. The outer structure 58 along with the insulated landing pad 42 is the preferred embodiment for reasons of mechanical strength.

Figure 5:
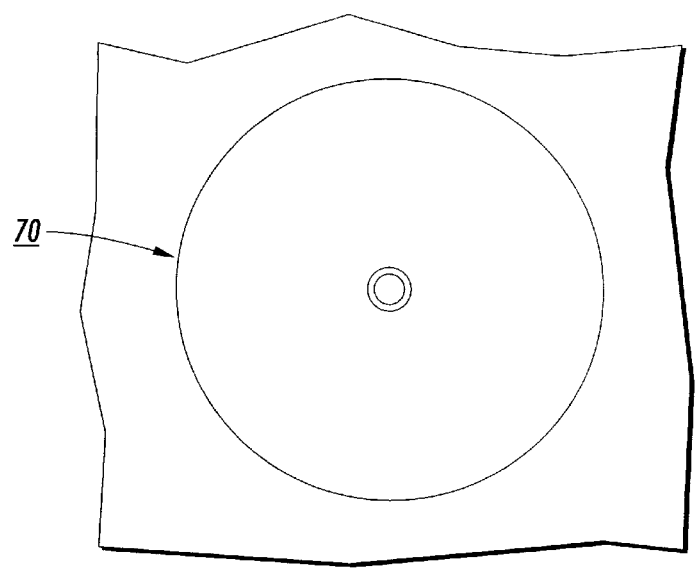
FIG. 5 shows close up of the lower electrode surface of the membrane with no damage.

FIG. 5 is the underside of an actual unused actuator membrane 70. There is no damage present on the lower electrode surface.

Figure 6:
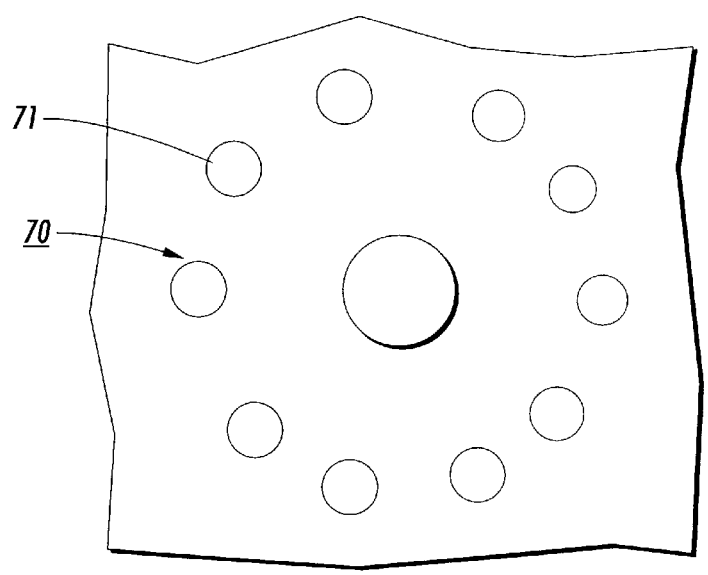
FIG. 6 shows close-up of arcing damage on the lower electrode surface of the membrane without the added outer structure to the diaphragm.

FIG. 6 is the underside of an actual actuator membrane 70, where operated without the present invention for several thousand cycles. Arcing damage 71 is present on the lower electrode surface.

It should be noted the actuator and the complete drop ejector can be formed using a well-known surface micromachining process, as taught in U.S. Pat. Nos. 5,867,302, 5,895,866, and 5,883,532, which are hereby incorporated by reference.

In recapitulation there has been provided silicon-based actuators including, a semiconductor substrate having an insulating layer, or an insulating substrate, a conductor on the insulating layer (counter-electrode), or insulating substrate, a membrane with a membrane top and membrane sides, and the membrane sides supporting the membrane above the conductor and the insulating layer. On the bottom of the membrane, a structure prevents the membrane center from touching the counter-electrode during actuation. An outer structure on the bottom side of the top of the membrane prevents the top of the membrane from flexing and touching the counter-electrode at points away from the center of the actuator. An actuator chamber is formed between the membrane and the insulating layer, with a nozzle plate surrounding the membrane, and a pressure chamber is formed between the nozzle plate and the membrane providing volume displacement. A nozzle is formed in the nozzle plate for ejecting fluid with a power source connected between the conductor and the membrane, and the power source when activated supplying sufficient force to deflect the membrane towards the counter-electrode, thereby increasing the supply of fluid in the pressure chamber. Fluid is ejected from the nozzle when the membrane is released.

While there has been illustrated and described what is at present considered to be a preferred embodiment of the present invention, it will be appreciated that numerous changes and modifications are likely to occur to those skilled in the art. It is intended in the appended claims to cover all those changes and modifications which fall within the spirit and scope of the present invention.

What is claimed is:

1. An electrostatic device, comprising:

a substrate having an insulating layer thereon;

a conductor formed on said insulating layer;

a membrane adjacent to said conductor; and an actuator chamber formed between said membrane and said conductor, said membrane flexing toward said conductor when a voltage bias is applied thereto, said membrane having (i) a membrane top; (ii) membrane sides for supporting said membrane above said conductor and said insulating layer; (iii) an inner protrusion structure, located on said membrane top, for preventing said membrane top from touching said conductor; and (iv) an outer protrusion structure, surrounding said inner protrusion structure, on said membrane top for reducing excessive flexing of said membrane top.

2. The electrostatic device as claimed in claim 1, wherein said inner protrusion structure and said outer protrusion structure, contact corresponding landing pads positioned on said conductor.

3. The electrostatic device as claimed in claim 2, wherein said landing pads that contact said outer protrusion structure are electrically isolated.

4. The electrostatic device as claimed in claim 1, wherein said conductor, said membrane, and said actuator chamber are each formed by surface micromachining.

5. The electrostatic device as claimed in claim 1, wherein said membrane top comprises one of a plurality of shapes.

6. The electrostatic device as claimed in claim 1, wherein said conductor comprises one of a plurality of shapes.

7. The electrostatic device as claimed in claim 1, further including a power source is connected between said conductor and said membrane for supplying sufficient force to deflect said membrane top towards said conductor.

8. The electrostatic device as claimed in claim 1, wherein said outer protrusion structure is radial.

9. The electrostatic device as claimed in claim 1, wherein said substrate is a semiconductor substrate.

10. The electrostatic device as claimed in claim 1, wherein said substrate is an insulating substrate.

11. The electrostatic device as claimed in claim 1, wherein said membrane is made of a material selected from said group consisting of silicon, polysilicon, glass and thin metallic film.

* * * * *